United States Patent [19]

Shichijo et al.

[11] 4,184,446
[45] Jan. 22, 1980

[54] REMOTE CONTROL APPARATUS FOR PRESETTING A TUNING DEVICE TO DESIRED STATIONS

[75] Inventors: Hajime Shichijo, Fujisawa; Hiroshi Hosono, Kawasaki, both of Japan

[73] Assignee: Sony Corporation, Tokyo, Japan

[21] Appl. No.: 974,234

[22] Filed: Dec. 29, 1978

[30] Foreign Application Priority Data

Dec. 29, 1977 [JP] Japan .................. 52-176777

[51] Int. Cl.² ........................................ G12B 11/04
[52] U.S. Cl. ............................. 116/262; 74/10.7; 74/89.22; 74/479; 74/483 PB; 116/242; 334/86; 325/455
[58] Field of Search .............. 116/241, 261, 262, 242, 116/282; 334/86; 74/479, 483 PB, 10.7, 89, 89.2, 89.22; 325/455

[56] References Cited

U.S. PATENT DOCUMENTS

| | | | |
|---|---|---|---|
| 3,416,486 | 12/1968 | Mongesku | 116/262 |
| 3,431,884 | 3/1969 | Marantz | 116/262 |
| 3,962,641 | 6/1976 | Suwa | 334/86 |
| 4,041,890 | 8/1977 | Wilder | 116/282 |

*Primary Examiner*—S. Clement Swisher
*Assistant Examiner*—Denis E. Corr
*Attorney, Agent, or Firm*—Lewis H. Eslinger; Alvin Sinderbrand

[57] ABSTRACT

Apparatus which finds particular application in a tuning device of the type which is tunable to different broadcast frequencies and which includes a scale provided with indicia corresponding to such broadcast frequencies and a pointer movable across the scale to indicate the particular broadcast frequency to which the tuning apparatus is tuned, the pointer being supported by a movable support which is guided by a guide shaft. A plurality of markers are slidably guided along at least one guide rail and are individually settable to desired locations adjacent the scale, thereby representing particular broadcast frequencies to which the tuning device is tunable. A key also is slidable along the guide shaft with the movable support, the key being selectively operative to engage a desired one of the markers to move the engaged marker therewith as the support is moved, whereby the marker is set to a desired position by reason of its engagement with the key. The apparatus includes a rotatable support for receiving and supporting the guide shaft, which shaft has a longitudinal groove therein for receiving a nub provided on the rotatable support. The rotatable support is, in turn, rotated in a support structure therefor by at least one finger which is in engagement with the rotatable support. An operating member, disposed remotely from the finger, is coupled to the finger by a flexible transmission means to move the finger; whereby the rotatable support is driven to rotate the guide shaft and, thus, the key to engage the latter with a desired marker.

13 Claims, 18 Drawing Figures

REMOTE CONTROL APPARATUS FOR PRESETTING A TUNING DEVICE TO DESIRED STATIONS

BACKGROUND OF THE INVENTION

This invention relates to apparatus for use in tuning devices and, more particularly, to remotely controlled apparatus which is used to preset the tuning device to desired ones of broadcast frequencies, such as FM and AM broadcast frequencies.

In many geographic locations, and particularly, larger metropolitan areas, a large number of FM and AM radio stations are available for reception. Thus, a user who has a home entertainment tuning device may receive a multitude of FM and AM broadcast frequencies. Often, the user may prefer to listen to the program entertainment which is transmitted over a relatively small number of such available broadcast frequencies. If a particular program received over one of these broadcast frequencies is not satisfactory, the user may adjust his tuning device so as to receive the program which is transmitted over another preferred broadcast frequency. However, many receivable broadcast frequencies may exist in the frequency band between the two stations to which the user tunes his tuning device. As the tuning condition of this device is changed, the programs which are transmitted via those intermediary broadcast frequencies will be received. Since the tuning condition of the tuning device is changed abruptly during this station-changing operation, the brief reception of undesired broadcast frequency information may be quite annoying and distracting to the user.

In order to rapidly change the tuning condition of a radio receiver from one station to another without accompanying noise or undesired program information which is present in those broadcast frequencies which lie between the two stations, push-button radio tuning apparatus has been proposed. Such push-button tuning devices are used advantageously in automotive radio receivers. However, such push-button tuning devices generally are not provided in high fidelity home entertainment tuning apparatus. Nevertheless, it is desirable to provide, in such home entertainment tuning apparatus, presettable means whereby the tuning apparatus can be rapidly tuned to preset FM and/or AM stations, and that such preset stations can be changed as desired, in accordance with the particular preferences of the user. Furthermore, such presettable means should be of simple construction, highly reliable, and relatively easy to operate.

OBJECTS OF THE INVENTION

Therefore, it is an object of the present invention to provide improved station preset means for use in tuning apparatus.

A further object of this invention is to provide, in tuning apparatus wherein certain FM and/or AM stations can be preset as desired, remote control means for controlling and changing the preset stations.

An additional object of this invention is to provide remote control apparatus for use in a tuning device wherein preset FM and/or AM stations can be changed easily and rapidly in accordance with the particular preferences of the user by operating the remote control apparatus.

Yet another object of this invention is to provide improved tuning apparatus of the aforedescribed type which is advantageously used in home entertainment radio receiving systems.

Various other objects, advantages and features of the present invention will become readily apparent from the ensuing detailed description, and the novel features will be particularly pointed out in the appended claims.

SUMMARY OF THE INVENTION

In accordance with this invention, remote control apparatus is provided for use in a tuning device of the type which can be tunable to different broadcast frequencies, some of which can be preset frequencies, having a scale with indicia thereon corresponding to the broadcast frequencies, a pointer movable across the scale to indicate the particular broadcast frequency to which the tuning device is tuned, a movable support assembly supporting the pointer and slidably driven along a guide shaft, and a plurality of markers slidably supported on at least one guide rail, each marker being individually settable to a desired position adjacent the scale so as to represent a particular broadcast frequency to which the tuning apparatus is tunable. A key also is slidable along the guide shaft with the support assembly, the key being selectively operative to engage a desired one of the markers and move the engaged marker therewith as the support assembly is driven, whereby the marker is set to a desired position by reason of its engagement with the key. The remote control apparatus controls the selective operation of the key to engage a marker and includes a rotatable support for receiving and supporting the guide shaft, which shaft has a longitudinal groove therein for receiving a nub provided on the rotatable support. The rotatable support is itself supported by a support structure and rotates in that structure when a finger, which is in engagement with the rotatable support, is moved. The finger is coupled to a remote operating member, such as a push-button provided on an operating panel of the tuning device, by a flexible transmission means. When the operating member is operated, the finger rotates the rotatable support which rotates the guide shaft to drive the key, whereby the latter engages a desired marker.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
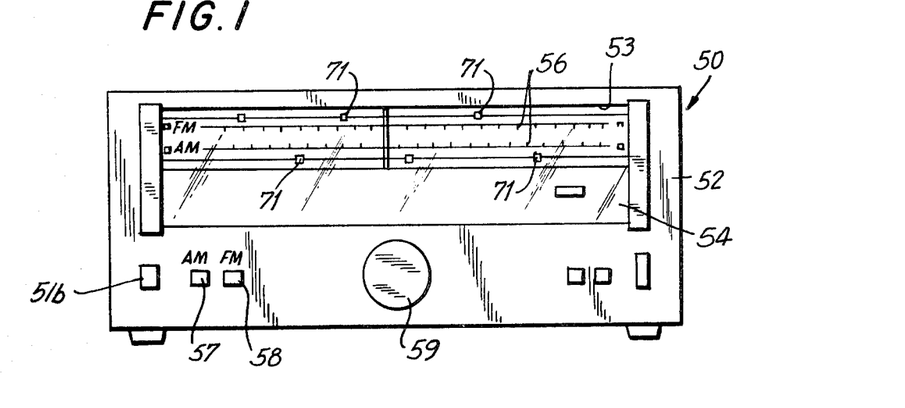
FIG. 1 is a front view of one embodiment of tuning apparatus which is provided with the present invention.
Figure 2:
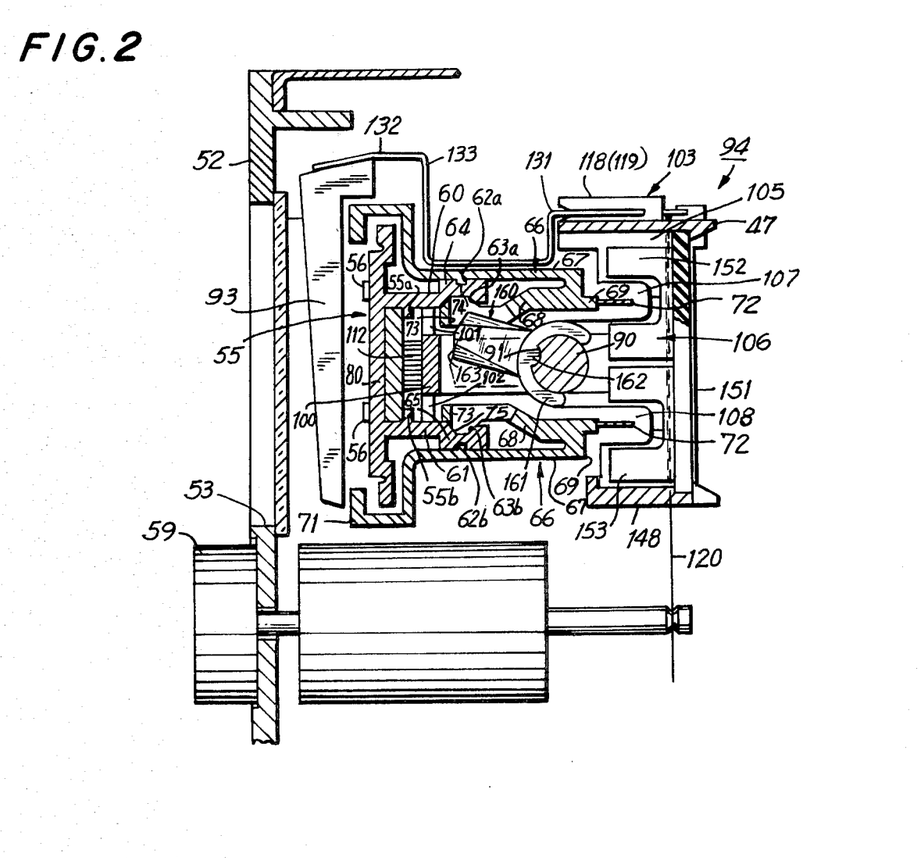
FIG. 2 is a partial sectional view of the mechanical arrangement of the tuning apparatus which can use this invention.

Referring now to the drawings, wherein like reference numerals are used throughout, and in particular to FIG. 1, there is illustrated a front view of tuning apparatus 50 which incorporates the various features disclosed herein. For the purpose of the present discussion, it will be assumed that tuning apparatus 50 is adapted to be tuned to broadcast frequencies included in the FM band as well as to broadcast frequencies included in the AM band. However, if desired, the teachings of the present invention can be incorporated in tuning apparatus which is tunable to broadcaast frequencies which are included only in the FM band or only in the AM band. Tuning apparatus 50 is provided with a front panel 52 in which are disposed various switches indicators which commonly are used to control the tuning and receiving conditions of, for example, high fidelity tuning devices. Front panel 52 is provided with a window 53 for receiving a transparent plate 54. Disposed behind this transparent plate, and as shown more particularly in FIG. 2, is a scale plate 55 bearing indicia 56 which represent the particular broadcast frequencies, or stations, to which the tuning apparatus is tunable. Operating switches 57 and 58 are provided in front panel 52, these operating switches being operable by a user of tuning apparatus 50 to preset either an AM broadcast frequency or an FM broadcast frequency to which the tuning apparatus is to be tuned. An FM/AM selector switch 51b is provided for the selection of a desired frequency band to be received. The tuning apparatus also is provided with a tuning knob 59 which is coupled to a shaft journaled for rotation in front panel 52 and operable to control the tuning condition of tuning apparatus 50. As tuning knob 59 is rotated, a pointer 93 is driven across scale plate 55 so as to represent the particular station, as identified by indicia 56, to which the tuning apparatus is tuned.

In accordance with one feature of the illustrated tuning apparatus, a plurality of indicators 71 are provided, these indicators being disposed in two sets, one set being associated with the FM frequency band and the other set being associated with the AM frequency band. As will be described in greater detail below, indicators 71 are slidable relative to scale plate 55 and can be set to any desired position therealong. When an indicator 71 is juxtaposed a particular indicium 56, thus representing the corresponding station to which tuning apparatus 50 can be tuned, the user may rapidly tune the tuning apparatus to that station merely by rotating tuning knob 59 until pointer 93 is aligned with that indicator 71. The position of indicator 71 along scale plate 55 can be adjusted, as desired by the user, so as to change the particular preset station to which the tuning apparatus can be tuned.

Figure 3:
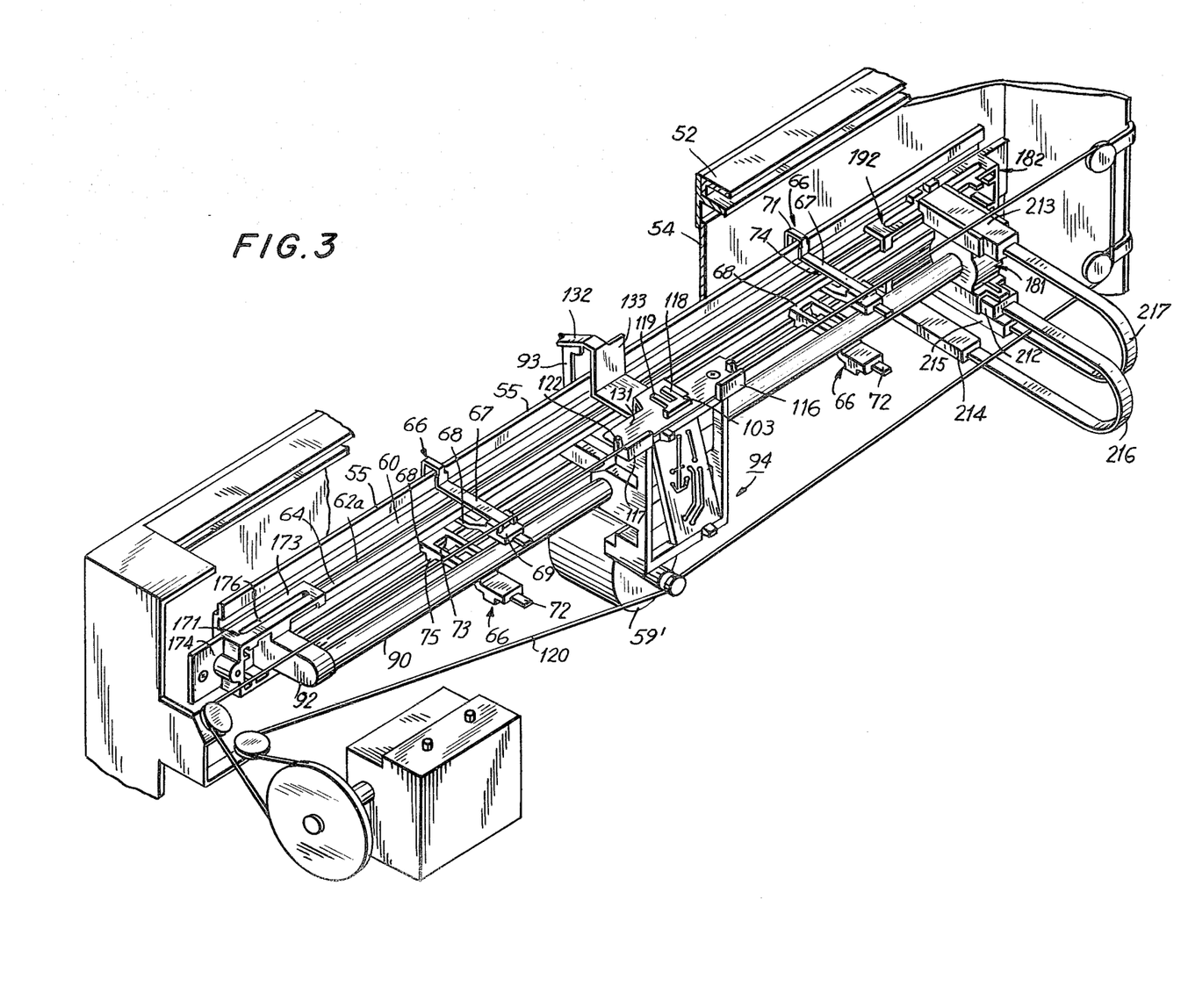
FIG. 3 is a perspective view of various sub-assemblies of the tuning apparatus which can be used with the present invention.

FIGS. 2 and 3 illustrate the sub-assembly which includes indicator 71 and the manner in which the respective indicators are supported and moved relative to scale plate 55. In particular, scale plate 55 is provided with an upper guide rail 60 and a lower guide rail 61, both guide rails extending in a longitudinal direction and being disposed in respective planes which are perpendicular to scale plate 55. The guide rails project from the rear surface of the scale plate. For the purpose of the present discussion, it is assumed that the "front" direction is toward front panel 52 and the "rear" direction is opposite thereto. Thus, indicia 56 are disposed on the front surface of scale plate 55, while upper and lower guide rails 60 and 61 both project from the rear surface of the scale plate. Upper guide rail 60 is provided with a longitudinal U-shaped groove 62a provided on the upper surface of rail extension 64, and with a longitudinal V-shaped groove 63a provided on the lower surface of rail extension 64. Lower guide rail 61 also is provided with a rail extension, designated as rail extension 65, and this rail extension is provided with a U-shaped groove 62b on the lower surface thereof. Thus, upper and lower guide rails 60 and 61 are seen to be mirror images of each other, and the respective grooves provided on rail extensions 64 and 65 likewise are mirror image versions, or inverted versions, of each other.

The respective rails extensions are furnished with the U-shaped and V-shaped grooves to provide a suitable support for markers 66 to which indicators 71 are attached. Each marker is provided with an upper leg 67 and a lower leg 68 which are joined at a juncture 69. Legs 67 and 68 are formed of a resilient material, such as a synthetic resin, and are biased naturally toward each other. Since these legs are resilient, they may be spread apart to be mounted upon rail extensions 64 and 65. A rib 74 is provided on the lower surface of leg 67 approximately mid-way of the length thereof. This rib fits into U-shaped groove 62a (or 62b) and is slidable therein. Lower leg 68 is provided with a rib 75 in the vicinity of the free end thereof, this rib being substantially V-shaped and adapted to fit into V-shaped groove 63a (or 63b) of rail extension 64 (or 65). When rib 74 is inserted into U-shaped groove 62a and when rib 75 is inserted into V-shaped groove 63a, marker 66 is slidable along the length of upper guide rail 60, and particularly, along the length of rail extension 64. In a similar manner, a marker 66 is mounted upon rail extension 65 of lower guide rail 61 so as to be slidable along the length of the guide rail.

Indicator 71 is seen to be a substantially U-shaped member which extends from the free end of leg 67. With reference to an upper marker 66, indicator 71 is an inverted U-shaped member which is bent around the upper edge of scale plate 55 so that the free end of the indicator is visible through window 53. As marker 66 slides along guide rail 60, the relative position of the marker is perceived by the juxtaposition of indicator 71 with respect to indicia 56. Similarly, the U-shape of indicator 71 provided on a lower marker 66 is not inverted, but is bent about the lower edge of scale plate 55. As the lower marker slides along guide rail 61, the position thereof is ascertained by perceiving the juxtaposition of indicator 71 relative to indicia 56.

In each marker 66, leg 68 is provided with an aperture 73. In an upper marker 66, aperture 73 faces toward lower guide rail 61; and, conversely, in a lower marker 66, aperture 73 faces toward upper guide rail 60. Each aperture is adapted to receive a key 160, selectively insertable therein, so that marker 66 is slidably driven along upper guide rail 60 or along lower guide rail 61 as the key is driven. This is described in greater detail in copending application Ser. No. 974,235, It will be appreciated that this slidable driving movement of marker 66 establishes the marker at a desired position along the guide rail, and thus at a desired position along scale plate 55 relative to indicia 56.

Each marker 66 is provided with a projection 72, used as a light shutter plate, described in copending application Ser. No. 974,229, extending rearwardly from juncture 69. The purpose of projection 72 is to intercept, or block light in a light switch when the light switch is moved to an aligned position with the respective marker 66. It will be explained that the light switch is housed in a sub-assembly which also is used to support pointer 93, whereupon projection 72 interrupts, or opens the light switch when pointer 93 is aligned with indicator 71 of the respective marker.

The manner in which a marker 66 is secured to a rail extension of either the upper or lower guide rail is readily apparent. That is, legs 67 and 68 are displaced from each other so that ribs 74 and 75 can be aligned with respect to the U-shaped and V-shaped grooves. Because of the resilience of the material with which marker 66 is constructed, when legs 67 and 68 no longer are forced apart, they return toward each other such that the ribs fit within the respective grooves in the rail extension. Preferably, leg 68 is wider than leg 67 such that the marker is supported with high stability. Rib 75 may, in fact, be formed of a pair of ribs disposed on opposite sides of aperture 73. Furthermore, because of the resilience of the material from which marker 66 is constructed, and since ribs 74 and 75 are of complementary shapes with respect to U-shaped and V-shaped grooves 62a and 63a, respectively, once the marker is fitted onto a guide rail, it is held in a stabilized position so as to resist misalignment thereof which may be caused by vibration. In its proper, normal position, the marker extends in a longitudinal direction normal to the rear surface of scale plate 55 so that projection 72 will be in proper alignment with the light switch when pointer 93 is aligned with indicator 71.

A guide shaft 90 is provided rearwardly of scale plate 55, this guide shaft extending lengthwise, as shown in FIG. 3, between a socket 92, disposed at one end thereof for supporting the guide shaft, and a rotatable support 181, provided at the other end thereof for supporting and driving the guide shaft. A support assembly 94 is slidably mounted on guide shaft 90, the support assembly serving to support pointer 93 and a wiper element 112, the latter being used in conjunction with tuning circuitry (not shown) for establishing a tuned condition, as explained in copending application Ser. No. 974,229. Support assembly 94 is comprised of a base which, in side view, appears as an E-shaped structure, whose middle leg is provided with a channel, through which guide shaft 90 passes.

Pointer 93 is included in a pointer assembly secured to support assembly 94 by a pointer mounting clip 103. In addition to having the pointer assembly mounted thereon, the support assembly forms a housing for a light switch 106. As described in copending application Ser. No. 974,229, this housing is provided with a central opening which extends from the top to the bottom of the housing. Gaps 107 and 108 are provided between the middle leg and the top and bottom legs, respectively, of the E-shaped support assembly. As shown in FIG. 2, projection 72 of markers 66 are adapted to be received in gaps 107 and 108 as support assembly 94 is slidably driven along guide shaft 90.

The support assembly has an upper portion which serves as a table upon which pointer mounting clip 103 is supported. An L-shaped ridge 116 is provided on the rear and left side edge of this upper portion, and a similar L-shaped ridge 117 is provided on the rear and right side edge of the upper portion. Pointer mounting clip 103 includes arms 118 and 119 which are joined at one end of each by a cross-piece, the free ends of these arms being chamfered and spaced from the upper portion of support assembly 94 so as to define a slot therebetween. This slot is adapted to receive a plate 131 to which pointer 93 is secured.

As best seen from FIG. 3, a cable 120 is provided to drive support assembly 94 as a function of the rotation of tuning knob 59. The tuning knob is coupled to cable 59 by suitable means, and this cable extends about various guide pulleys and also is secured to support assembly 94.

The pointer assembly is comprised of plate 131 having a forwardly extending portion 132 which is coupled to the plate by a gooseneck extension 133. Plate 131 and gooseneck extension 133 preferably are of a resilient material, such as a spring metal, a synthetic resin, or the like.

As mentioned above, support assembly 94 defines a housing 105 for light switch 106. The upper wall of this housing is provided with a releasable catch 147 and, similarly, the lower wall of the housing is provided with a releasable catch 148. These releasable catches are similar to each other and each is shown as a flexible leg terminating in a wedge-shaped hook.

Light switch 106 is formed of a back plate 151, upon which a printed circuit is provided, as shown in FIG. 3. The light switch includes two C-shaped housings 152 and 153 (FIG. 2) secured to back plate 151 and disposed one atop the other. Each C-shaped housing is provided with a gap such that when light switch 106 is inserted into housing 105, these gaps are aligned with gaps 107 and 108, respectively. Light switch 106 further includes an optically aligned light source and light sensor contained in each C-shaped housing.

In order to assemble light switch 106 in housing 105, the light switch in inserted into the housing so that the C-shaped housings and positioned in the central portion of housing 105. When back plate 151 reaches releasable catches 147 and 148, the catches are spread apart so that the back plate can abut against the walls of housing 105, whereupon the hooks of releasable catches 147 and 148 grip the rear surface of back plate 151. In the event that a light source or a light sensor must be replaced, light switch 106 can be removed from housing 105 merely by spreading releasable catches 147 and 148 apart so that the hooks thereon release back plate 151; and then by sliding light switch 106 rearwardly out of housing 105.

As described in greater detail in copending application Ser. No. 974,229, the combination of one light source and one light sensor constitutes one switch, and the combination of another light source and another light sensor constitutes another switch. The first-mentioned switch is associated with the FM frequency band and the second-mentioned switch is associated with the AM frequency band. When light from, for example, the first light source impinges upon the first light sensor, the switch defined thereby is closed so as to mute the signal output of the tuning apparatus. When light is blocked from impinging upon the light sensor, the light switch is opened so as to terminate, or release, this muting operation. It may be appreciated that the presence of a projection 72, mounted on the rear portion of a marker 66, when inserted within the gap between a light source and a light sensor serves to block light from impinging upon the light sensor, thereby opening the respective switch.

As mentioned briefly hereinabove, key 160 is provided to be selectively inserted into aperture 73 of a marker 66 so as to engage the marker and thereby position same to a desired location along upper or lower guide rails 60 and 61, relative to indicia 56 on scale plate 55. Key 160 is slidably mounted on guide shaft 90 and includes an arcuate gripping member 161 whose free end portions are separated by an angle of about 100°. Gripping member 161 is made of a resilient material, such as a synthetic resin, and includes a nub 162 projecting in a radially inward direction, this nub being inserted into longitudinal groove 91 of guide shaft 90.

The key additionally includes an engaging member 163 secured to gripping member 161. Engaging member 163 is a bar extending in a radially outward direction from the gripping member, this engaging member being tapered at the upper and lower portions thereof so that it can be inserted easily into aperture 73 of a marker 66.

As shown in FIG. 3, one end of drive shaft 90 is supported in socket 92 and is rotatable therein. This socket is mounted on a C-shaped support bracket 171 which is adapted to be secured to scale plate 55 and to front panel 52 or to the chassis of the tuning apparatus. The support bracket includes a pair of legs, one of which is shown at 173, which legs are joined at one end thereof by a cross member 174. The cross member is a relatively flat plate which includes a hole for the purpose of affixing support bracket 171 to an appropriate member (such as the front panel or the chassis) or the tuning apparatus.

Each of the legs of bracket 171 is provided with a slit 176, to add resiliency to the legs, whereby support bracket 171 can be mounted over guide rails 60 and 61 of scale plate 55.

The other end of guide shaft 90, that is, the end of the guide shaft which is remote from the end supported in socket 92, is supported in a rotatable support 181 which, in turn, is provided in a support structure 182, as shown in FIG. 3. The purpose of rotatable support 181 is to receive an end of guide shaft 90 and, moreover, to be turned either in the clockwise or counterclockwise direction so as to impart a corresponding rotation to the guide shaft supported thereby. As will be explained below, this turning movement of rotatable support 181 is controlled from a remote location and, particularly, is controlled by the user of the tuning apparatus in response to his depression of operating switches 57 and 58 (FIG. 1).

Figure 6:
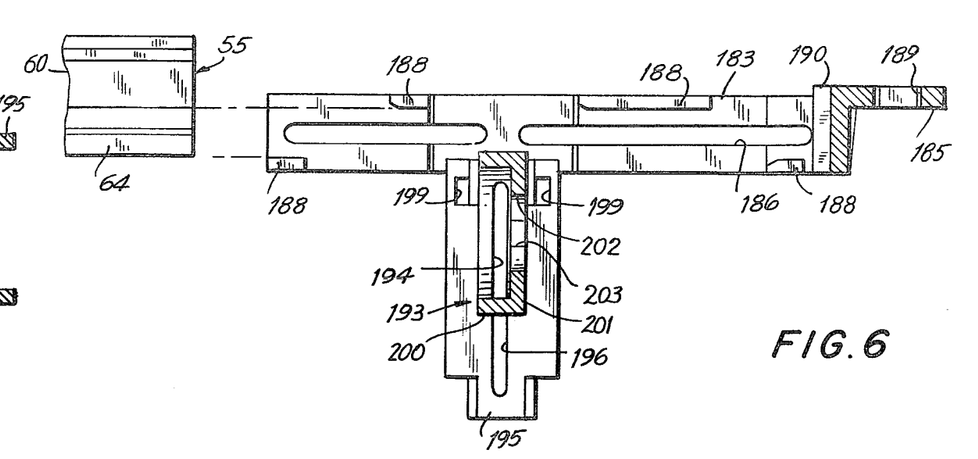

Turning first to the construction of support structure 182, this structure is shown more particularly in FIGS. 4–7. Support structure 182 is similar to aforedescribed support bracket 171 in that the support structure is comprised of a substantially C-shaped member formed of legs 183 and 184, these legs being joined at one end thereof by a cross member 185. Leg 183 is provided with at least one length-wise slit 186 therein and, similarly, leg 184 also is provided with at least one length-wise slit 187. As shown in FIG. 6, each leg may be comprised of two such slits disposed along a longitudinal axis and spaced from each other. These slits provide sufficient resiliency to legs 183 and 184.

Each leg of support structure 182 is provided with a number of projections 188 adapted to grip the rail extensions of the upper and lower guide rails. Thus, projections 188 on leg 184 are adapted to grip rail extension 64 of upper guide rail 60; and projections 188 on leg 183 are adapted to grip rail extension 65 on lower guide rail 61. Support structure 182 thus is mounted upon scale plate 55 at an end of the scale plate remote from the end upon which support bracket 171 is mounted. At the joining portion of the C-shaped support structure 182, that is, in the vicinity of cross member 185, ribs 190 are provided, these ribs facing toward scale plate 55 such that, when the support structure is mounted upon the scale plate, ribs 190 serve as stops against which the scale plate abuts. Consequently, when assembled, the scale plate is disposed in a desired, predetermined position with respect to support structure 182. Cross member 185 is provided with a hole 189, for receiving a screw or other securing device so as to fix support structure 182, together with scale plate 55 upon which the support bracket is mounted, to front panel 52 or the chassis of the illustrated tuning apparatus. Thus, by reason of support bracket 171 and support structure 182 mounted upon opposite ends of scale plate 55, the scale plate is suitably positioned within window 53 of front panel 52 of the tuning apparatus.

Each leg 183 and 184 is provided with a respective elongated U-shaped bracket 191 and 192. When the support structure 182 is properly mounted upon scale plate 55, U-shaped bracket 191 opens in the downward direction and U-shaped bracket 192 opens in the upward direction. Both brackets extend rearwardly of scale plate 55. Each U-shaped bracket 191 and 192 is of similar construction and, in the interest of brevity, only bracket 191 is described in detail. Bracket 191 is shown in the sectional view of FIG. 6.

As illustrated, U-shaped bracket 191 is provided with an arm 195, this arm extending rearwardly when support structure 182 is mounted upon scale plate 55, and this arm also serving as the base of the U-shaped bracket. A longitudinal slit 196 is provided in arm 195, and side members 197 and 198 extend from opposite lengthwise edges of arm 195. These side members 197 and 198 constitute the legs of the U-shape. A pair of slots 199 is provided in side members 197 and 198, respectively, these slots being located in the vicinity of leg 183 upon which the U-shaped bracket 191 is mounted, and these slots extending through arm 195, as shown in FIG. 6.

Figure 7:
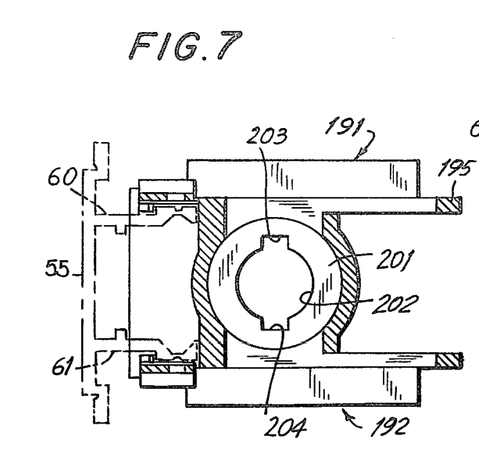

U-shaped bracket 192, which is of similar construction, cooperates with U-shaped bracket 191 to support a support ring member 193 therebetween. This support ring member is adapted to receive rotatable support 181 and is comprised of a cup-shaped member 200, shown more clearly in FIG. 6, the opening of the cup-shaped member extending in the direction toward socket 92. Cup-shaped member 200 includes an end base 201, shown also in FIG. 7, this end base being provided with a circular aperture 202 whose diameter is less than the diameter of the opening of cup-shaped member 200. Cut-out portions 203 and 204, shown more clearly in FIG. 7, are provided in end base 201 and are diametrically opposite to each other so as to extend the diameter of circular aperture 202 at the locations of these cut-out portions. A pair of slots 194 is provided in the peripheral wall of cup-shaped member 200, these slots being diametrically opposed to each other and, as shown in FIG. 4, may be on the same diameter as cut-out portions 203 and 204.

Figure 4:
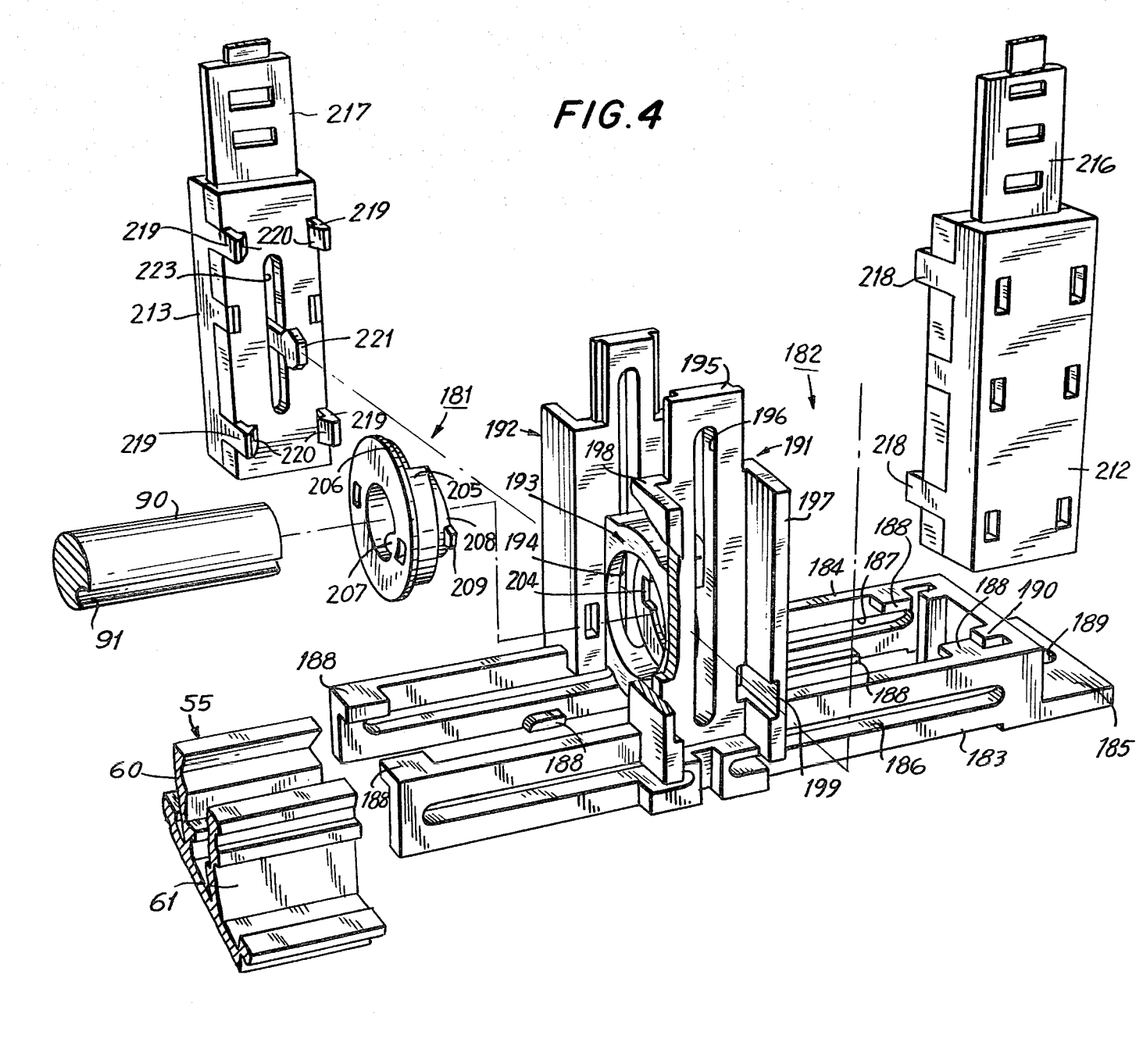
FIG. 4 is a perspective, exploded view of the rotatable support and support structure which are used to supportably drive a guide shaft in accordance with the present invention.
Figure 5:
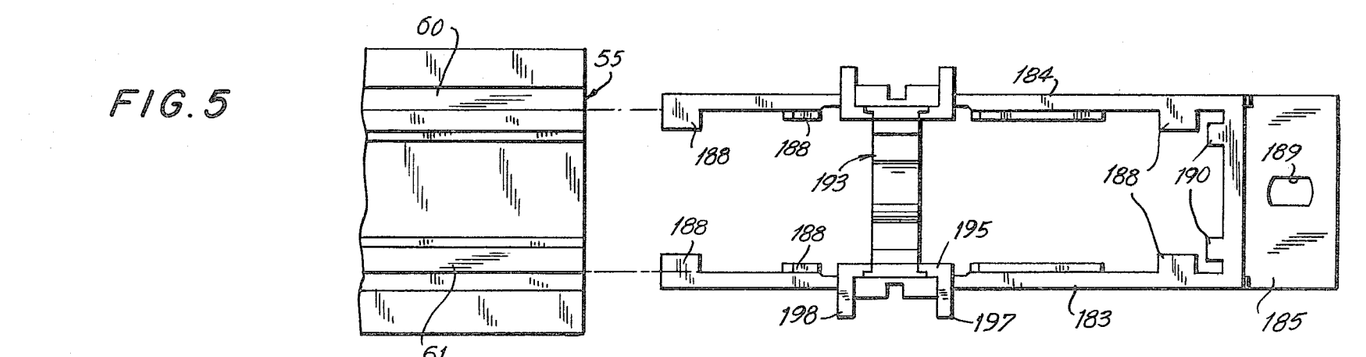
FIG. 5–7 are top, sectional side and sectional front views of the support structure shown in FIG. 4.
Figure 8:
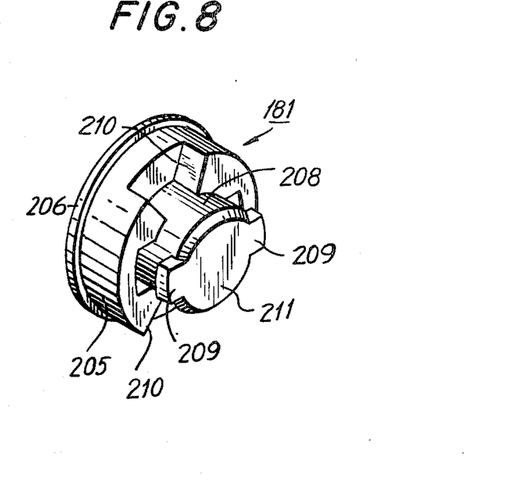
FIG. 8 is a perspective view of the rotatable support shown in FIG. 4.
Figure 9:
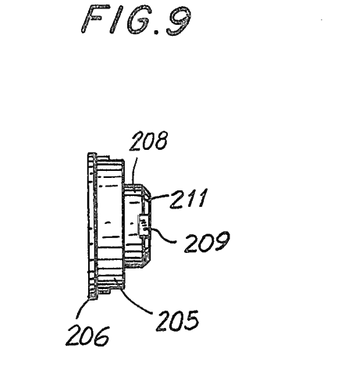
FIGS. 9–11 are side, rear and front views of the rotatable support.
Figure 10:
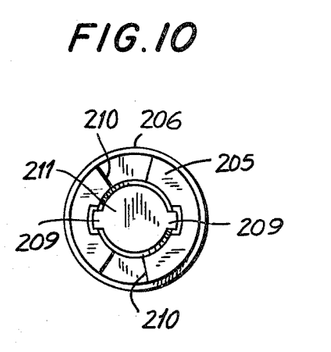
Figure 11:
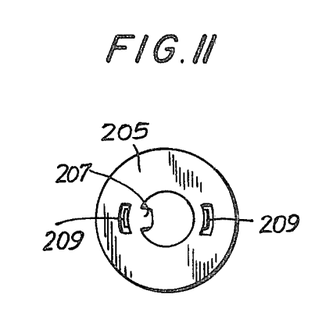
Figure 12:
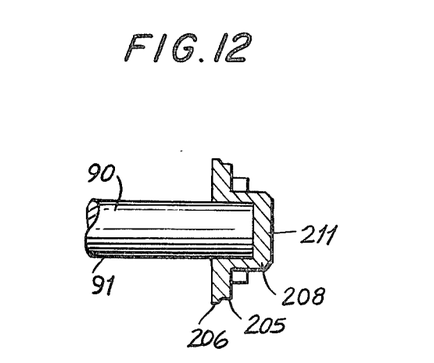
FIG. 12 is a sectional view representing the manner in which the guide shaft is rotatably supported in the rotatable support.

Rotatable support 181 which is shown in FIG. 4 in exploded form with respect to support structure 182, and which is shown in greater detail in FIGS. 8-12, is comprised of two circular cylinders, or members, 205 and 208. These circular members are concentric with each other and are arranged to be axially adjacent, or axially overlapped with each other, as shown in FIGS. 8 and 9. Circular member 205 is provided with a circular flange 206 on the periphery thereof. The diameter of circular flange 206 obviously is greater than the outer diameter of circular member 205. A nub 207, shown in FIGS. 4 and 11, is provided on the inner wall, or cavity, of circular member 205. A pair of arcuate cut-out portions 210 is provided in the outer wall of circular member 205, as shown in FIGS. 8 and 10. These cut-out portions are opposite to each other and are angularly displaced by about 180° or less.

Circular member 208 is disposed behind circular member 205 and has an outer diameter which is less than the outer diameter of circular member 205. Circular member 208 is provided with a base 211 so as to provide an end cap to the rotatable support which receives guide shaft 90. Projections 209 are provided on end cap 211, these projections extending radially outward from the base and being diametrically opposed to each other. It may be appreciated that, in assembly, that is, when rotatable support 181 is assembled with support structure 182, projections 209 are accommodated by cut-out portions 203 and 204 in end base 201.

An alternative construction of rotatable support 181 is comprised of an inner cylindrical member, corresponding to circular member 208, and an outer cylindrical member, corresponding to circular member 205, the outer cylindrical member circumscribing the inner cylindrical member and having an axial length which is less than the axial length of the inner cylindrical member. A flange, similar to flange 206, is provided on the outer cylindrical member; and arcuate cut-out portions 210 also are provided on the peripheral wall of the outer cylindrical member. One end of the inner cylindrical member is sealed with and end cap, similar to base 211, this end cap having projections, or wings, extending radially outward therefrom, similar to projections 210. In either embodiment, guide shaft 90 is received by the interior opening, or cavity, which is provided in circular members 205 and 208, or which is provided in the inner cylindrical member, with nub 207 being inserted into groove 91.

In assembling rotatable support 181 to support structure 182, the rotatable support is inserted through the opening of cup-shaped member 200, with base 211 passing through this opening first. Rotatable support 181 is aligned such that projections 209 extending from base 211 pass through cut-out portions 203 and 204, these latter cut-out portions being provided in end base 201 of support ring member 193. The outer diameter of circular member 208 is less than the inner diameter of circular aperture 202; and the outer diameter of circular member 205 is less than the inner diameter of the opening of cup-shaped member 200. Hence, rotatable support 181 is easily received in cup-shaped member 200. Since projections 209 on base 211 pass through cut-out portions 203 and 204, base 211 extends rearwardly of circular aperture 202. The diameter of circular flange 206 is greater than the opening of cup-shaped member 200 and, therefore, this flange abuts against the peripheral wall of the cup-shaped member. Rotatable support 181 now is rotated about 90° so that projections 209 abut against end base 201 of cup-shaped member 200. Thus, the cup-shaped member is sandwiched between flange 206 and projections 209. Rotatable support 181 is rotated sufficiently such that arcuate cut-out portions 210 provided in the outer peripheral wall of circular member 205 are aligned with slots 194 in the peripheral wall of cup-shaped member 200. In this alignment, and as will be explained, a finger 211 can extend through a slot 194 to be received by a cut-out portion 210.

In assembling guide shaft 90 to the tuning apparatus, support bracket 171, with socket 92 affixed thereto, may be mounted upon guide rails 60 and 61, and then guide shaft 90 may be inserted into socket 92. Then, support structure 182, with rotatable support 181 assembled therewith, may be slid onto guide rails 60 and 61. As the same time, rotatable support 181 slides into receiving relationship with the other end of guide shaft 90 such that nub 207 is inserted into groove 91. Hence, as support structure 182 is mounted upon guide rails 60 and 61, the open end of rotatable support 181 slides onto guide shaft 90. It is appreciated that, since nub 207 is received by groove 91, rotatable support 181 is keyed to guide shaft 90 such that any rotation in the rotatable support correspondingly rotates the guide shaft.

The manner in which rotatable support 181, and thus guide shaft 90 and key 160 are remotely controlled now will be described with reference to FIGS. 4 and 13. A housing 212 is mounted upon U-shaped bracket 191, and a similar housing 213 is mounted upon U-shaped bracket 192. In particular, housing 212 is provided with legs 218 and, similarly, housing 213 is provided with legs 219. Each housing is a substantially rectangular-shaped block structure with legs 218 and 219 respectively extending from one surface of that structure. Each of legs 218 and 219 terminates in a hook member, for example, hook member 220 which is provided at the free end of each leg 219 and which is wedge-shaped. A pair of legs 218 of housing 212 is adapted to be inserted into corresponding slots 199 which are provided in side members 197 and 198, respectively, of U-shaped bracket 191. Similar slots are provided in the side members of U-shaped bracket 192 for receiving a pair of hook members 220 which are provided on one pair of legs 219 of housing 213. Hook members 220, provided on another pair of legs 219, are adapted to engage the lip or rim of the central arm, such as arm 195 of U-shaped bracket 193. With respect to housing 212, it is seen that the uppermost pair of legs 218 is positioned beyond side members 197 and 198 of U-shaped bracket 191.

A respective finger 221, 222 is disposed within each housing 213 and 212 and, as shown with respect to housing 213, finger 221 projects therefrom through slot 223. When housings 212 and 213 are mounted upon U-shaped brackets 191 and 192, respectively, in the manner described above, respective fingers 222, 221 project through slits, such as slit 196, provided in each arm, such as arm 195, of U-shaped brackets 191 and 192. These fingers further extend through slots 194 which are provided in the peripheral walls of cup-shaped member 200. Hence, fingers 221, 222 extend from housings 213 and 212 into arcuate cut-out portions 210 so as to be in driving engagement with rotatable support 181.

Fingers 221, 222 are controlled in response to the manual operation of operating switches 57 and 58, shown in FIG. 1. These operating switches, reproduced in FIG. 13, are, for example, releasable push-button switches which, when depressed, operate to move the respective finger 221 or 222 in housing 213 or 212, respectively. To this effect, transmission straps 217 and 216 are connected between housings 213, 212 and operating switches 57, 58, respectively. A securing block 214 is mechanically coupled to operating switch 58 to receive transmission strap 216; and, similarly, a securing block 215 is coupled to operating switch 57 to receive transmission strap 217. These transmission straps may be of the conventional type including pins and slots which cooperate with engaging mechanisms within the securing block at one end thereof and the housing at the other end thereof such that when an operating switch is depressed, the finger associated with that switch is moved. A spring release mechanism also may be provided, whereby when the depressed operating switch is released, the transmission strap returns to its normal, quiescent position, thereby also returning the finger connected thereto to its normal, quiescent position.

Figure 13:
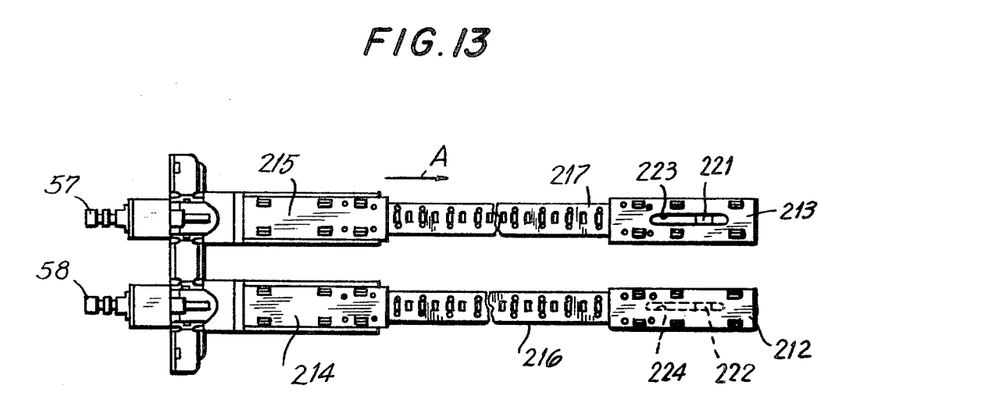
FIG. 13 represents the remote control apparatus which is used to rotatably drive the guide shaft in accordance with the present invention.
Figure 14:
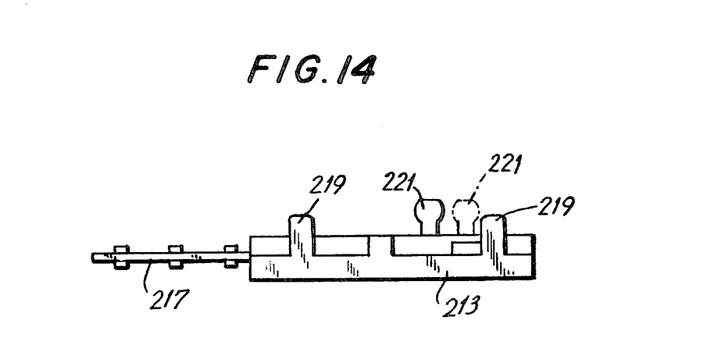
FIGS. 14 and 15 are side and front views of the securing block which is used in the remote control apparatus.
Figure 15:
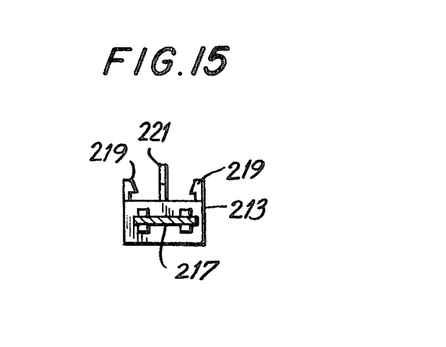

FIG. 14 is a side view of housing 213 wherein finger 221 is shown, by broken lines, in its active position in response to the forward movement of strap 217, that is, movement of the strap in the direction indicated by the arrow A in FIG. 13. FIG. 15 is an end view of housing 213, showing strap 217 and finger 221. FIG. 3 shows the assembly of housings 212 and 213 which are coupled to securing blocks 214 and 215 via transmission straps 216 and 217, respectively. It is, of course, recognized that securing blocks 214 and 215 terminate in operating switches 58 and 57, respectively, these switches being provided on front panel 52, as shown in FIG. 1.

Figure 16:
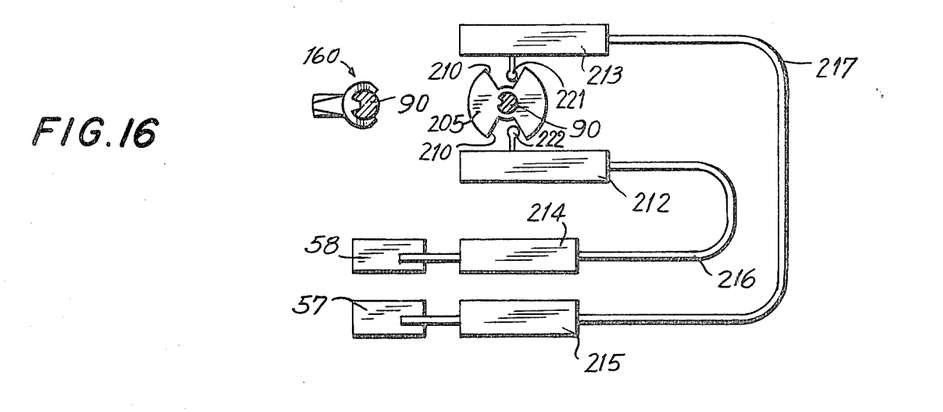
FIGS. 16–18 represent the manner in which the remote control apparatus rotatably drives the guide shaft and, in turn, the key, whereby a marker can be preset to any desired location.
Figure 17:
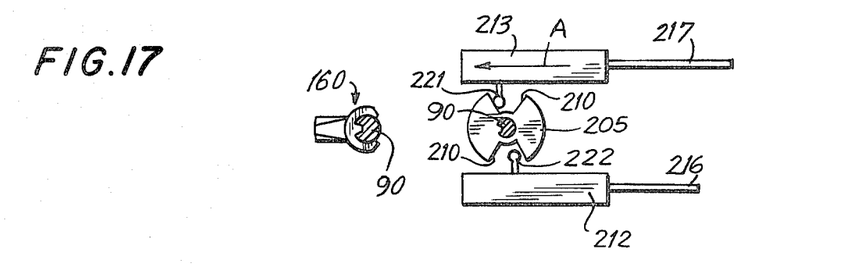
Figure 18:
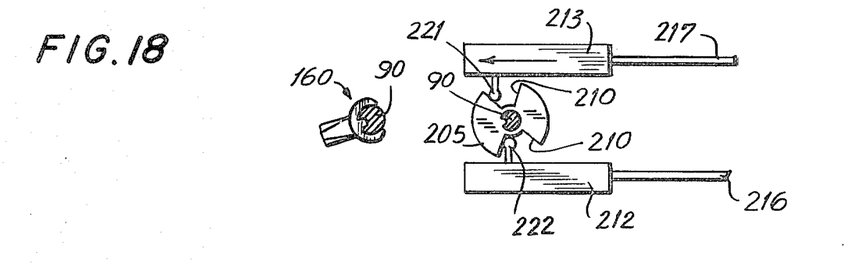

The manner in which operating switches 57 and 58 are used now will be described with reference to FIGS. 16–18. Let it be assumed that a marker 66 associated with, for example, the AM frequency band, is to be moved from one station-identifying location to another. Tuning knob 59 is operated so as to drive cable 120, thereby moving support assembly 94 along guide shaft 90. When pointer 93 is aligned with indicator 71 of the appropriate marker, tuning knob 59 no longer is operated. Instead, operating switch 57 is depressed, thereby moving transmission strap 217 in the forward direction, that is, in the direction from securing block 215 toward housing 213. This, in turn, moves finger 221, projecting from housing 213 into arcuate cut-out portion 210 of circular member 205 included in rotatable support 181, in the right-to-left direction, as viewed in FIGS. 16–18, and as indicated by arrow A in FIG. 17. This, in turn, rotates rotatable support 181 in the counterclockwise direction, as shown in FIG. 18. Accordingly, drive shaft 90 also is rotated in the counterclockwise direction, whereby key 160, which is secured to guide shaft 90, also is rotated in this direction. Consequently, engaging member 163 of key 160 is inserted into aperture 73 of the marker with which the key is aligned, that is, the marker whose indicator 71 is juxtaposed pointer 93.

Once marker 66 is engaged by key 160 in the foregoing manner, tuning knob 59 may be rotated so that support assembly 94 again is driven along guide shaft 90, either toward the right or toward the left, as desired by the user. As support assembly 94 is driven, key 160 is pushed by the support assembly, whereby marker 66 slides along lower guide rail 61 to any additional desired position.

When support assembly 94 reaches a preferred position along scale plate 55, as indicated by the particular indicium 56 aligned with pointer 93, and thus with indicator 71, the depressed operating switch 57 can be released. This, in turn, returns transmission strap 217 to its normal, quiescent position, whereby finger 221 projecting from housing 213 moves in the left-to-right direction so as to be restored to its normal position. When the finger moves in this direction, it contacts the right-most edge of arcuate cut-out portion 210 so as now to rotate rotatable support 181 in the clockwise direction. This, in turn, rotates guide shaft 90 and key 160 in the clockwise direction. Consequently engaging member 163 is withdrawn from aperture 73, thereby disengaging key 160 from marker 66. The marker now remains at its present position, thus representing a desired broadcast frequency, or AM station, to which the illustrated tuning apparatus may be tuned. Of course, if it is desired to alter the position of this marker, the foregoing operation can be repeated, whereby operating switch 57 is depressed so as to engage key 160 with this marker and thereby enable the marker to be displaced when tuning knob 59 is rotated.

An operation similar to the aforedescribed is performed in the event that a marker 66 associated with the FM band is to be adjusted, or positioned, to a location along scale plate 55 corresponding to a desired FM broadcast frequency. It is, of course, appreciated that when operating switch 58 is depressed, finger 222, projecting from housing 212, moves in the right-to-left direction (as viewed in FIGS. 16–18) so as to rotate support 181 in the clockwise direction. This, in turn, rotates guide shaft 90 and key 160 in the clockwise direction. Hence, engaging member 163 of key 160 is inserted into aperture 73 of a marker 66 mounted on upper guide rail 60, whereby the key engages this marker. Then, if tuning knob 59 is rotated, support assembly 94 and key 160 are driven along guide shaft 90 in the desired direction. This, in turn, slides marker 66 along upper guide rail 60. When indicator 71 of marker 66 is juxtaposed an indicium corresponding to a desired FM broadcast frequency, or station, operating switch 58 is released so as to disengage key 160 from marker 66. The marker then remains at this location, thereby indicating the particular broadcast frequency to which the tuning apparatus may be tuned.

The tuning circuitry which can be used in tuning apparatus 50 is disclosed in greater detail in copending application Ser. No. 974,229. Once markers 66 have been preset to their desired locations, the output of the tuning circuitry effectively is muted (if muting switch 51b is operated) if pointer 93 is at any position other than in alignment with an indicator 71 of a preset marker. Thus, undesired noise between preset stations is muted. When pointer 93 is aligned with an indicator 71, the muting operation is inhibited. In particular, in this alignment, projection 72 of marker 66 blocks light from a light source in light switch 106 so that this light does not impinge on its associated light sensor. This opens the light switch to inhibit the muting operation. But when pointer 93 is not aligned with an indicator, light from the light source is enabled to impinge on its associated light sensor to close the light switch and thus enable the muting operation. Hence, tuning apparatus 50 can be tuned rapidly and accurately to any desired, preset AM or FM station. If it is desired to override this automatic muting operation, that is, muting between stations, muting switch 51b need not be operated.

While the present invention has been particularly shown and described with reference to a preferred embodiment, various changes and modifications in form and details may be made without departing from the spirit and scope of the invention. Some of these changes and modifications have been discussed hereinabove. In addition to these, it is appreciated that, if desired, still other guide rails, similar to guide rails 60 and 61, may be provided, each additional guide rail being associated with a respective frequency band, such as a citizen's band, a short wave band, or the like. Markers, similar to aforedescribed markers 66, may be provided on these additional guide rails for positioning to any desired location so as to preset corresponding frequencies to which the tuning apparatus can be tuned. The manner in which these additional markers are positioned is similar to that described above. Furthermore, although this invention finds ready application in the environment of a tuning device, the particular uses of the invention should be limited only by the appended claims.

It is, therefore, intended that the appended claims be interpreted as including these, as well as the foregoing and other such changes, modifications and uses.

What is claimed is:

1. Apparatus for selectively rotating a shaft, comprising rotatable support means for receiving and supporting said shaft, said shaft having a longitudinal groove therein and said support means having a nub positioned in said groove; a support structure for supporting said support means, said support means being rotatable in said support structure; at least one finger in engagement with said support means and movable to rotatably drive said support means; an operating member disposed remotely from said at least one finger for imparting movement to said finger; and flexible transmission means coupled between said operating member and said finger to move said finger when said operating member is operated.

2. The apparatus of claim 1 wherein said support structure composition a stationary support ring member having at least one slot therein through which said at least one finger passes; and wherein said rotatable support means comprises a first circular member having a diameter less than the interior diameter of said support ring member to be inserted for rotation therein, said first circular member having a circular flange whose diameter is greater than said interior diameter of said support ring member, and a second circular member secured to said first circular member and having a diameter sufficient to be inserted for rotation into said support ring member, said second circular member having radially extending projections whose effective diameter is greater than the interior diameter of said support ring member such that said support ring member is sandwiched between said circular flange and said projections.

3. The apparatus of claim 2 wherein said first circular member is provided with at least one arcuate cut-out portion for receiving said at least one finger passing through said at least one slot in said supporting ring member.

4. The apparatus of claim 3 wherein said support ring member is substantially cup-shaped having an end-base provided with a substantially circular aperture of diameter less than the diameter of the open end of said cup-shape, said diameter of said second circular member being less than the diameter of said circular aperture so as to pass therethrough; and said end-base being provided additionally with cut-out portions for receiving said radially extending projections of said second circular member; such that said first and second circular members, when inserted into said cup-shape, are secured therein by rotating at least said second circular member to bring said projections extending radially therefrom out of alignment with said cut-out portions.

5. The apparatus of claim 4 further comprising at least one housing for said at least one finger, said finger being movable in said houing; and at least one bracket secured to said cup-shape for mounting said housing thereon.

6. The apparatus of claim 4 wherein said second circular member is cup-shaped to provide an end support for said shaft.

7. Tuning apparatus comprising a scale having indicia thereon representing broadcast frequencies to which said tuning apparatus is tunable; at least one guide rail; plural marking means slidably supported on said at least one guide rail and positionable to settable locations juxtaposed said scale to indicate predetermined broadcast frequencies to which said tuning apparatus can be tuned; pointer means movable across said scale for indicating the broadcast frequency to which said tuning apparatus is presently tuned; a rotatable guide shaft extending substantially parallel to said at least one guide rail; support means slidably supported on said guide shaft for supporting said pointer means said support means being driven along said guide shaft to correspondingly move said pointer means; engagement means slidably supported on said guide shaft and rotatable with said guide shaft between inactive and active positions, said engagement means being engageable with one of said marking means when in said active position to slide said one marking means along said guide rail as said engagement means slides along said guide shaft; and control means operative from a location remote from said engagement means to rotate said engagement means and including a rotatable drive member keyed to said guide shaft, a cup-shaped support member for receiving said drive member, said drive member being rotatable in said cup-shaped support member, means for substantially preventing axial movement of said drive member within said cup-shaped member, at least one finger engageable with said drive member for causing said drive member to rotate, an operating member disposed remotely from said at least one finger for imparting movement thereto, and flexible transmission means coupled between said operating member and said finger to move said finger when said operating member is operated.

8. The apparatus of claim 7 wherein said rotatable drive member comprises first and second axially arranged concentric cylinders having equal inner diameters for receiving said guide shaft, the outer diameter of said first cylinder being greater than the outer diameter of said second cylinder, said first cylinder being provided with a circular flange at one axial end of the drive member, and said second cylinder being provided with extensions projecting radially therefrom and disposed at the other axial end of the drive member.

9. The apparatus of claim 8 wherein said cup-shaped support member has an open end provided with an inner diameter greater than the outer diameter of said first cylinder but less than the diameter of said circular flange, and a base end provided with an aperture whose diameter is greater than the outer diameter of said second cylinder but less than the effective diameter of said radial extensions, said base end additionally being provided with cut-out portions through which said radial extensions pass, whereby said drive member is supported in said cup-shaped member with said circular flange adjacent said open end and said radial extensions adjacent said base end.

10. The apparatus of claim 9 wherein said cup-shaped member includes a side wall extending from said base end and having at least one slot through which said at least one finger passes to engage said drive member.

11. The apparatus of claim 10 further comprising a bracket for supporting said cup-shaped member; and a housing for said finger, said housing being releasably coupled to said bracket for locating said finger to pass through said slot.

12. The apparatus of claim 11 wherein said second cylinder is provided with a closed end to block axial movement of one end of said guide shaft.

13. The apparatus of claim 12 wherein said first cylinder is provided with at least one finger-receiving portion for receiving said at least one finger, whereby movement of said finger imparts rotary motion to said drive member.

* * * * *